(12) United States Patent
Chen et al.

(10) Patent No.: US 7,125,581 B2
(45) Date of Patent: Oct. 24, 2006

(54) EVAPORATION METHOD AND APPARATUS THEREOF

(75) Inventors: Chun-An Chen, Fongshan (TW); Chi-Hsien Tuan, Taoyuan (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/692,588

(22) Filed: Oct. 24, 2003

(65) Prior Publication Data

US 2004/0091251 A1 May 13, 2004

(30) Foreign Application Priority Data

Oct. 25, 2002 (TW) .............................. 91125119 A

(51) Int. Cl.
C23C 14/14 (2006.01)
C23C 14/24 (2006.01)

(52) U.S. Cl. .................... 427/251; 118/726; 118/730

(58) Field of Classification Search ............... 118/726, 118/730, 727; 427/251
See application file for complete search history.

(56) References Cited

U.S. PATENT DOCUMENTS

| | | | | |
|---|---|---|---|---|
| 3,750,623 A | * | 8/1973 | Carpenter et al. | 118/723 VE |
| 3,797,452 A | * | 3/1974 | Dobson | 118/730 |
| 4,222,345 A | * | 9/1980 | Bergfelt et al. | 118/720 |
| 4,310,614 A | * | 1/1982 | Connell et al. | 430/270.12 |
| 4,791,261 A | * | 12/1988 | Phinney et al. | 219/634 |
| 5,230,923 A | * | 7/1993 | Hirokawa et al. | 427/248.1 |
| 5,622,564 A | * | 4/1997 | Vignola et al. | 118/715 |
| 6,280,792 B1 | * | 8/2001 | Tochishita et al. | 427/248.1 |
| 6,340,501 B1 | * | 1/2002 | Kamiyama et al. | 427/255.6 |
| 6,475,287 B1 | * | 11/2002 | Clark | 118/721 |
| 6,676,990 B1 | * | 1/2004 | Hatwar et al. | 427/66 |
| 2003/0010288 A1 | * | 1/2003 | Yamazaki et al. | 118/715 |

FOREIGN PATENT DOCUMENTS

JP  59-133366  * 7/1984

OTHER PUBLICATIONS

Webster's New World Dictionary of the american Language, The World Publishing Co., 1972, p. 1013.*

* cited by examiner

Primary Examiner—Richard Bueker
(74) Attorney, Agent, or Firm—J.C. Patents

(57) ABSTRACT

An evaporation method and an apparatus thereof are disclosed. The evaporation apparatus comprises a rotator, a heater and a source supplying device. The rotator, which is disposed above the central portion of the substrate, can rotate the substrate. An evaporation source is disposed on the heater, and the evaporation region is a circular region. The heater and the source supplying device are disposed below the substrate, wherein the source supplying device provides the evaporation source on the heater along a supply direction. In order to prevent the location of the evaporation source shifts along the supply direction from affecting the uniformity of deposited film, a circular trace is defined and the heater is disposed below the circular trace so that the supplying direction is parallel to the tangential direction of the circular trace.

14 Claims, 4 Drawing Sheets

_US 7,125,581 B2_

EVAPORATION METHOD AND APPARATUS THEREOF

CROSS-REFERENCE TO RELATED APPLICATION

This application claims the priority benefit of Taiwan application serial no. 91125119, filed Oct. 25, 2002.

BACKGROUND OF THE INVENTION

1. Field of the Invention

The present invention relates to an evaporation method and an apparatus thereof, and more particularly to an evaporation method for improving the uniformity of a film deposited at the center of a substrate and an apparatus thereof.

2. Description of the Related Art

Generally, Physical Vapor Deposition (PVD) includes evaporation and sputtering. Both of them are performed by physical deposition. The evaporation deposition is performed by heating deposition material at the saturated vapor pressure thereof. It is usually performed in a vacuum evaporator, which includes an evaporation chamber and a vacuum system. The detailed description of prior art evaporation apparatus is described below.

FIG. 1 is a schematic showing a prior art evaporation apparatus. Referring to FIG. 1, an evaporation apparatus 100 is utilized to deposit metal or the other materials on a substrate 10, which can be, for example, a glass substrate. The evaporation apparatus 100 comprises a rotator 110, a heater 120, a source supplying device 130 and a shelter 140. The rotator 110 is disposed above the center of the substrate 10. The rotator 110 can rotate the substrate 10 by the center thereof. The heater 120 is disposed under the substrate 10. The heater 120 is usually made of refractory material. The heater 120 is connected to a power supply (not shown). When a current or voltage is supplied to the heater 120, the heater 120 generates heat because of its resistance. The source supplying device 130 is disposed over the heater 120. The source supplying device 130 supplies an evaporation source 122 to the heater 120 along a supplying direction S. The evaporation source 122 is provided by delivery of metal wires. The shelter 140 is disposed between the substrate 10 and the source supplying device 130. The shelter 140 has an opening 142. The opening 142 of the shelter 140 serves to define the evaporation region 124 on the substrate 10 formed by the evaporation source 122.

FIG. 2 is a top view showing a prior art evaporation apparatus. Referring to FIGS. 1 and 2, when the heater 120 heats the evaporation source 122 to the melting point thereof, the evaporation source 122 evaporates and deposits on the substrate 10. Theoretically, the evaporation source 122 provided by the source supplying device 130 is delivered to location A on the heater 120 and the edge of the evaporation region 124 aligns to the center of the substrate 10. A film is formed on the substrate 10 by rotating the substrate 10 for evaporation. However, the evaporation source 122 provided by the source supplying device 130 is not always delivered to location A; it could be delivered to location B or location C. The evaporation region 124 shifts because of different locations of the evaporation source 122.

As described above, if the evaporation source 122 provided by the source supplying device 130 is delivered to location B of the heater 120, the evaporations region 124 covers the center of the substrate 10. If the evaporation source 122 provided by the source supplying device 130 is delivered to location C of the heater 120, the evaporations region 124 does not cover the center of the substrate 10. Accordingly, different locations of the evaporation source 122 affect the uniformity of the film at the center of the substrate 10. Therefore, the uniformity of the film formed on the substrate becomes worse.

SUMMARY OF THE INVENTION

Accordingly, one object of the present invention is to provide an evaporation method and an apparatus thereof for improving the uniformity of a film deposited on a substrate.

In order to achieve the object described above, the present provides an evaporation method, which comprises providing a substrate, fixing the center of the substrate and rotating the substrate by a center thereof; defining a circular trace by the center of the substrate; providing a heater; providing a source supplying device, wherein the source supplying device supplies an evaporation source to the heater along a supplying direction; disposing the heater and the source supplying device under a point of the circular trace and adjusting the supplying direction of the source supplying device for paralleling the supplying direction and a tangential direction of the point of the circular trace; and heating the evaporation source by the heater for evaporation.

In an embodiment of the present invention, a shelter is disposed between the source supplying device and the substrate for defining an evaporation region. The radius of the evaporation region is substantially similar to that of the circular trace. Furthermore, the rotational direction of the substrate can be, for example, clockwise or counterclockwise. In addition, the evaporation source is, for example, aluminum or silver.

The present invention provides an evaporation apparatus for depositing a film on a substrate, which comprises: a rotator fixing the center of a substrate and rotating the substrate to define a circular trace; a heater disposed under a point of the circular trace; and a source supplying device disposed over the heater, wherein the source supplying device supplies an evaporation source to the heater along a supplying direction and the supplying direction is parallel to a tangential direction of the circular trace.

In an embodiment of the present invention, a shelter is disposed between the source supplying device and the substrate, wherein the shelter has an opening for defining an evaporation region on the substrate. The shape of the opening is, for example, circular. The radius of the evaporation region is substantially similar to that of the circular trace and an edge of the evaporation region is aligned to the center of the substrate. Furthermore, the rotational direction of the substrate can be, for example, clockwise or counterclockwise. In addition, the evaporation source is, for example, aluminum or silver. The heater is, for example, a rectangular loading crucible.

In order to make the aforementioned and other objects, features and advantages of the present invention understandable, a preferred embodiment accompanied with figures is described in detail below.

DESCRIPTION OF EMBODIMENTS

Figure 1:
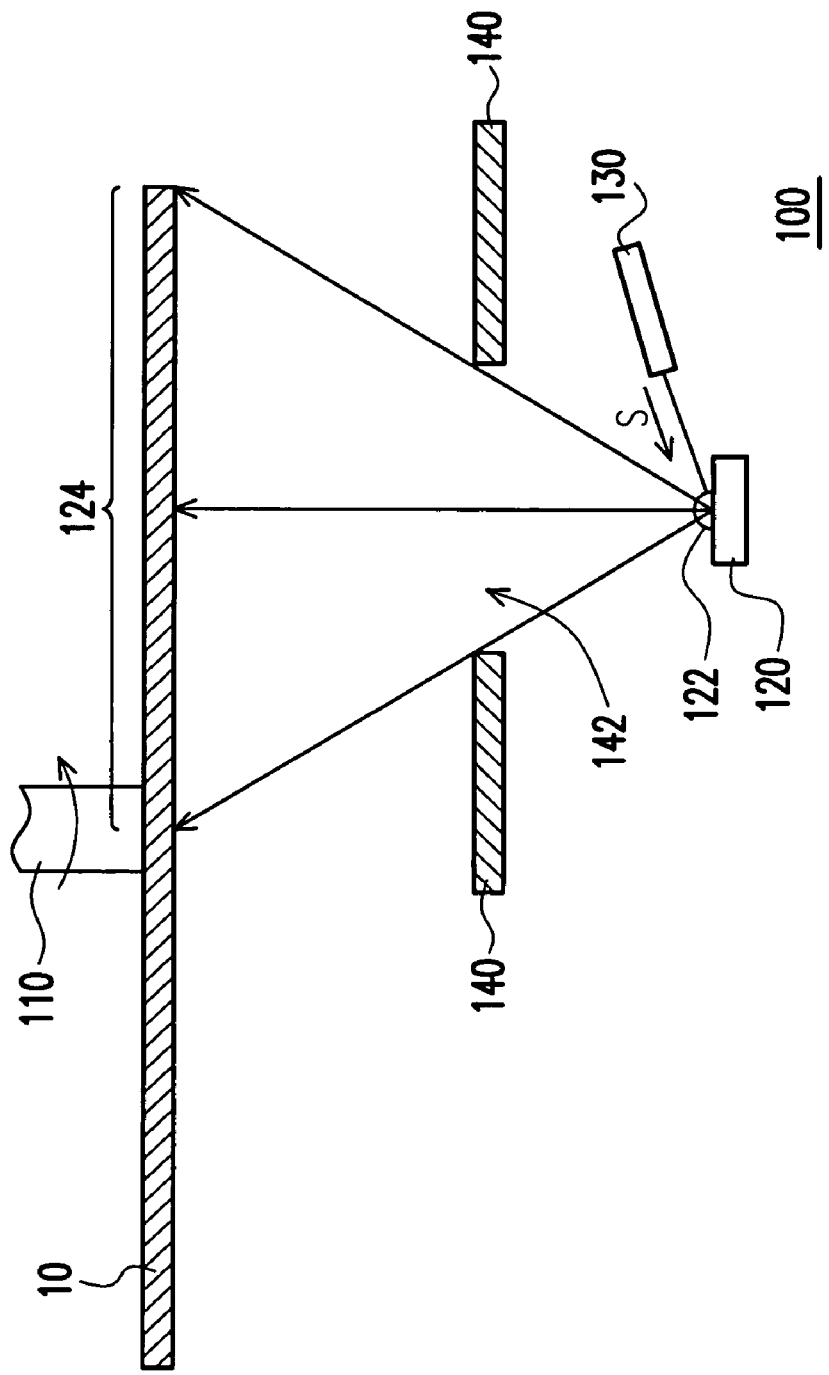
FIG. 1 is a schematic view showing a prior art evaporation apparatus.
Figure 2:
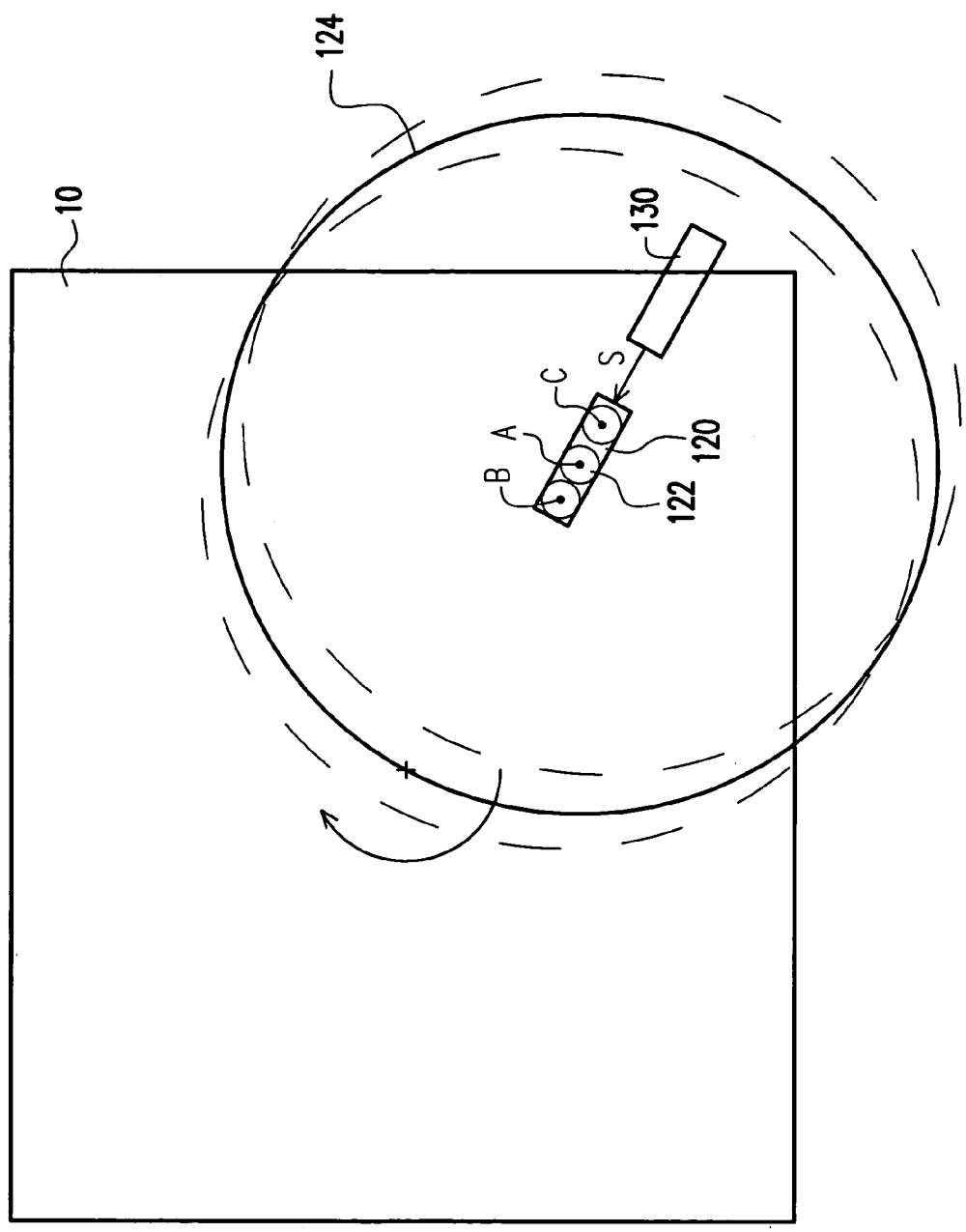
FIG. 2 is a top view showing another prior art evaporation apparatus.
Figure 3:
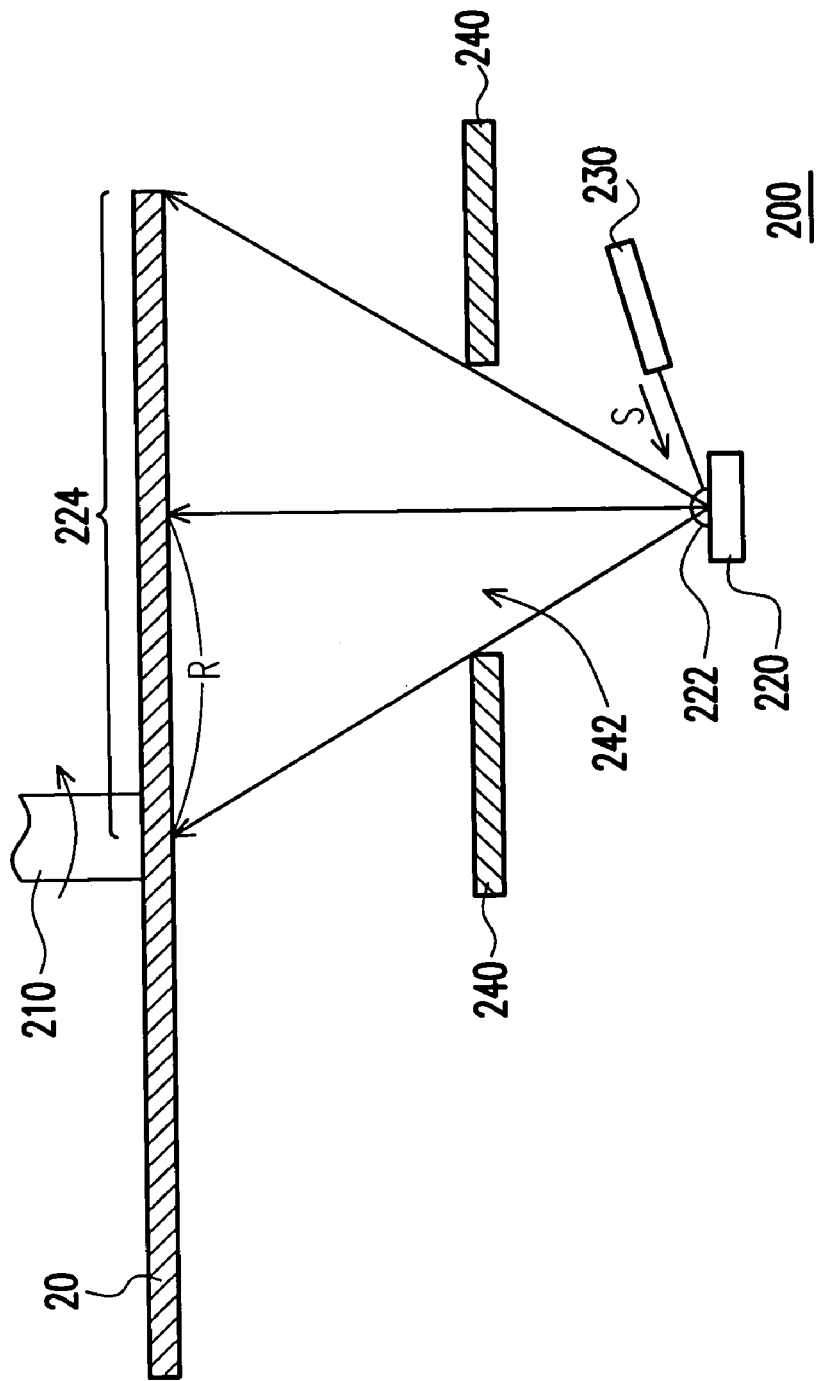
FIG. 3 is a schematic view showing an evaporation apparatus according to a preferred embodiment of the present invention.

FIG. 3 is a schematic view showing an evaporation apparatus according to a preferred embodiment of the present invention. Referring to FIG. 3, an evaporation apparatus 200 can be utilized to deposit metal or the other materials on a substrate 20, which can be, for example, a glass substrate. The evaporation apparatus 200 comprises a rotator 210, a heater 220, a source supplying device 230 and a shelter 240. The rotator 210 can fix the center of the substrate 20. The rotator 210 can rotate the substrate 20, for example, in a clockwise or counterclockwise direction by the center thereof.

The heater 220 is disposed under the substrate 20. The heater 220 is, for example, a rectangular or any other sharp loading crucible. The heater 220 is usually made of refractory material. The heater 220 is connected to a power supply (not shown). When a current or voltage is supplied to the heater 220, the heater 220 generates heat because of its resistance. The source supplying device 230 is disposed over the heater 220. The source supplying device 230 supplies an evaporation source 222 to the heater 220 along a supplying direction S. The evaporation source 222 can be, for example, aluminum or silver. The evaporation source 222 is provided by delivery of metal wires.

The shelter 240 is disposed between the substrate 20 and the source supplying device 230. The shelter 240 has an opening 242 therein, which can be, for example, a circular opening. The opening 242 of the shelter 240 serves to define the evaporation region 224 on the substrate 20 formed by the evaporation source 222. The evaporation region 224 is, for example, a circular region having a radius R and the edge of the evaporation region 224 is aligned to the center of the substrate 20.

Figure 4:
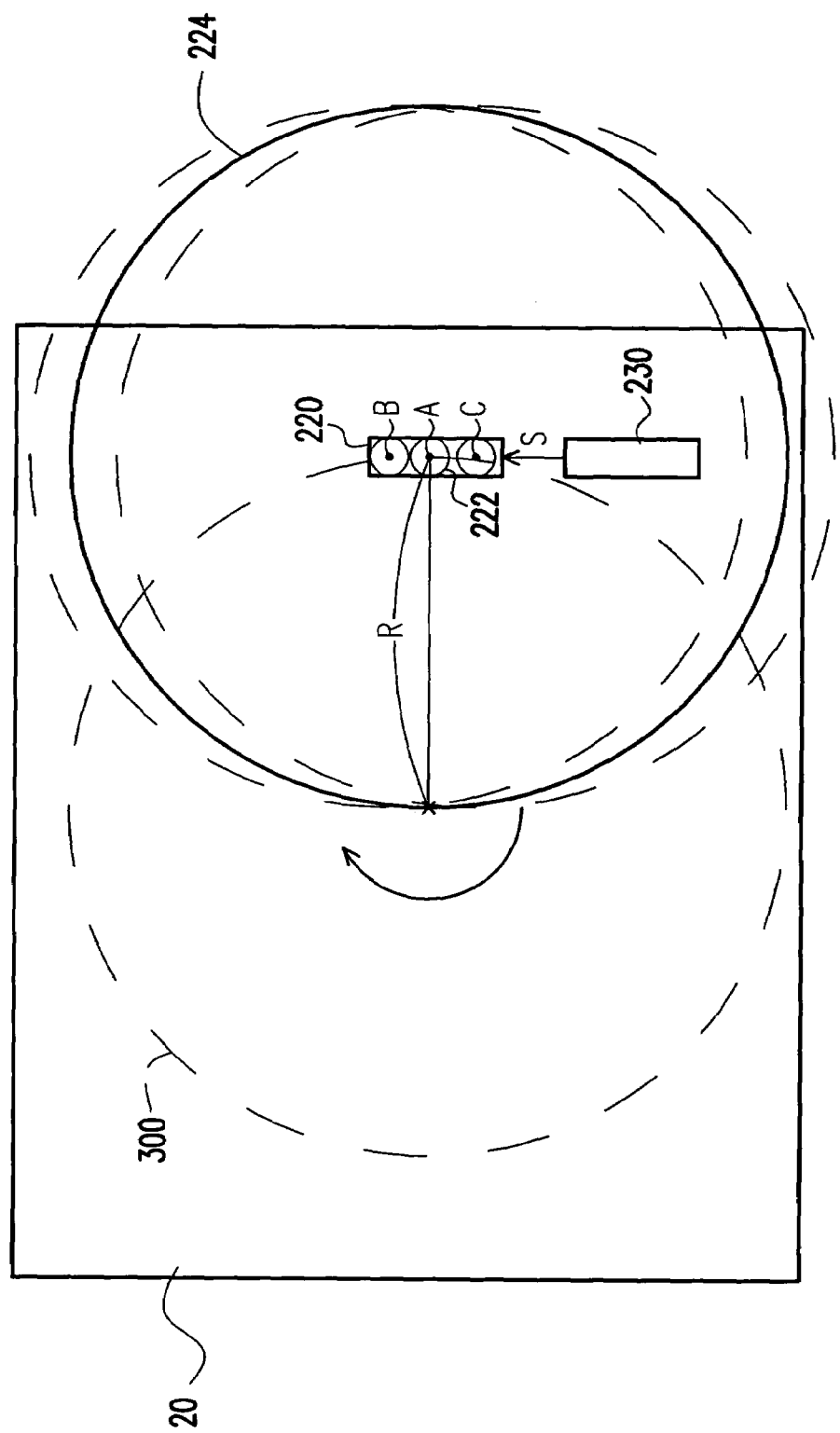
FIG. 4 is a top view showing an evaporation apparatus according to a preferred embodiment of the present invention.

FIG. 4 is a top view showing an evaporation apparatus according to a preferred embodiment of the present invention. Referring to FIG. 4, the evaporation apparatus of the present invention defines a circular trace 300 by the center of the substrate 20. The radius of the circular trace 300 is substantially similar to that of the evaporation region 224. The heater 220 is disposed under a point of the circular trace 300 and the supplying direction S of the source supplying device 230 is adjusted for paralleling the supplying direction S and the tangential direction of the point of the circular trace 300. The heater 220 then heats the evaporation source 222 for evaporation.

From the descriptions mentioned above, the supplying direction S is parallel to the tangential direction of the point of the circular trace 300. When the evaporation source 222 provided form the source supplying device 230 is not delivered to location A, but to location B or location C, the edge of the evaporation region 224 aligns to the center of the substrate 20. Therefore, even if the evaporation source 222 is delivered to different locations (A, B or C) on the heater 220, the edge of the evaporation region 224 still aligns to the center of the substrate 20. In other word, the delivered location of the evaporation source 222 on the heater 220 will not substantially affect the thickness of a film at the center of the substrate. Therefore, the uniformity of the substrate is improved.

Accordingly, the present invention has at least the following advantages:
the evaporation method of the present invention can improve the uniformity of the film deposited on the substrate by modifying the disposition of the source supplying device; and the evaporation apparatus of the present invention can improve the uniformity of the film deposited on the substrate without substantially restructuring the apparatus.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention.

What is claimed is:

1. An evaporation method, comprising:
providing a substrate, wherein the substrate is rotating around an axis of rotation at the center of the substrate, said axis of rotation is perpendicular to a plane of the top surface of the substrate;
defining a circle on the plane of the top surface of the substrate, wherein the center of said circle is the center of the substrate;
providing a heater right under a point on the circle;
providing a source supplying device, wherein the source supplying device supplies a metal wire as an evaporation source in a source supplying direction to a source evaporation point on the heater, such that a vertical line intersects said point on said circle and said source evaporation point;
adjusting the source supplying direction of the source supplying device so that a projection of the source supplying direction on said plane of the top surface of the substrate is a tangent of the circle at said point on the circle; and
heating the evaporation source by the heater for evaporation.

2. The evaporation method of claim 1, further comprising disposing a shelter between the source supplying device and the substrate for defining an evaporation region.

3. The evaporation method of claim 2, wherein a radius of the evaporation region is substantially similar to that of the circle.

4. The evaporation method of claim 1, wherein a rotational direction of the substrate is clockwise.

5. The evaporation method of claim 1, wherein a rotational direction of the substrate is counterclockwise.

6. The evaporation method of claim 1, wherein the evaporation source is aluminum or silver.

7. An evaporation apparatus for depositing a film on a substrate, the evaporation apparatus comprising:
a rotator driving the substrate to be rotating around an axis of rotation at the center of the substrate to define a circle on a plane of the top surface of the substrate, wherein the center of said circle is the center of the substrate;
a heater, disposed right under a point on the circle, wherein the heater has a source evaporation point thereon; and
a source supplying device, disposed over the heater, wherein the source supplying device supplies a metal wire as an evaporation source in a source supplying direction to said source evaporation point on the heater and wherein said source supplying device is positioned such that a projection of the source supplying direction on said plane of the top surface of the substrate is a tangent of the circle at the point on the circle, wherein a vertical line intersects said point on said circle and said source evaporation point.

8. The evaporation apparatus of claim 7, further comprising a shelter disposed between the source supplying device and the substrate for defining an evaporation region, wherein the shelter has an opening for defining the evaporation region on the substrate.

9. The evaporation apparatus of claim 8, wherein the opening is a circular opening.

10. The evaporation apparatus of claim 9, wherein a radius of the evaporation region is substantially similar to that of the circle.

11. The evaporation apparatus of claim 7, wherein the evaporation source is aluminum or silver.

12. The evaporation apparatus of claim 7, wherein a rotational direction of the substrate is clockwise.

13. The evaporation apparatus of claim 7, wherein a rotational direction of the substrate is counterclockwise.

14. The evaporation apparatus of claim 7, wherein the heater is a rectangular loading crucible.

* * * * *